(12) United States Patent
Park et al.

(10) Patent No.: US 7,492,206 B2
(45) Date of Patent: Feb. 17, 2009

(54) LEVEL SHIFTER WITH REDUCED LEAKAGE CURRENT AND BLOCK DRIVER FOR NONVOLATILE SEMICONDUCTOR MEMORY DEVICE

(75) Inventors: Ki Tae Park, Hwasung-si (KR); Jung Dal Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 57 days.

(21) Appl. No.: 11/604,701

(22) Filed: Nov. 28, 2006

(65) Prior Publication Data

US 2007/0139077 A1 Jun. 21, 2007

(30) Foreign Application Priority Data

Dec. 6, 2005 (KR) ...................... 10-2005-0117840

(51) Int. Cl.
*H03L 5/00* (2006.01)
(52) U.S. Cl. .............................. 327/333; 326/63; 326/81
(58) Field of Classification Search ................. 327/306, 327/333; 326/62–64, 80–81
See application file for complete search history.

(56) References Cited

U.S. PATENT DOCUMENTS 5,448,198 A * 9/1995 Toyoshima et al. .......... 327/530
6,208,200 B1 * 3/2001 Arakawa ..................... 327/589
7,002,400 B2 * 2/2006 Koo ............................ 327/536

FOREIGN PATENT DOCUMENTS

| KR | 10199976164 | 10/1999 |
| KR | 1020000044917 | 7/2000 |
| KR | 1020030079427 | 10/2003 |

\* cited by examiner

*Primary Examiner*—Dinh T. Le
(74) *Attorney, Agent, or Firm*—Volentine & Whitt, PLLC

(57) ABSTRACT

A level shifter is disclosed and generates an output signal having a swing voltage shifted by a positive boost voltage with respect to an input signal. The level shifter comprises; an enable unit adapted to enable the output signal in response to the input signal, and a disable unit adapted to disable the output signal in response to the input signal. The enable unit comprises; a shifting voltage terminal adapted to receive the boost voltage, a control node, a shifting unit disposed between the shifting voltage terminal and the control node and responsive to the output signal, such that a voltage having a difference with the boost voltage lower than a voltage of the output signal is provided to the control node, whereby the output signal is boosted by the positive boost voltage, a control PMOS transistor disposed between the control node and the output signal and gated by the input signal, and bulk voltage generation unit adapted to generate a predetermined bulk voltage having a voltage difference with the boost voltage lower than that of the control node to a bulk of the control PMOS transistor.

12 Claims, 9 Drawing Sheets

LEVEL SHIFTER WITH REDUCED LEAKAGE CURRENT AND BLOCK DRIVER FOR NONVOLATILE SEMICONDUCTOR MEMORY DEVICE

BACKGROUND OF THE INVENTION

1. Field of the Invention

Embodiments of the invention relate generally to a nonvolatile semiconductor memory devices. More particularly, embodiments of the invention relate to a level shifter adapted to shift a swing voltage and a block driver including same.

This application claims priority to Korean Patent Application No. 10-2005-117840 filed Dec. 6, 2005, the subject matter of which is hereby incorporated by reference.

2. Description of the Related Art

Nonvolatile semiconductor memory devices include a plurality of memory cells adapted to store data. During a data programming operation, a high-level program voltage (e.g., 23.5 V) is provided to the word line of a selected memory cell. To accomplish the programming operation, however, a transmission transistor adapted to transmit the program voltage must be gated by a block word signal. The block word signal is typically a shifted or boosted voltage signal (e.g., 25 V). Thus, the block word voltage is higher than the program voltage.

In this regard, the block word signal is activated in response to a decoding signal adapted to select a memory block including the memory cell to be programmed. A power supply voltage is typically used as a pull-up voltage for the decoding signal. Therefore, in order to generate the block word signal using a pull-up voltage to generate a boosted voltage, a level shifter circuit is generally embedded within a block driver adapted to generate the block word signal.

FIG. 1 is a circuit diagram illustrating a level shifter embedded in a conventional block driver. In the level shifter of FIG. 1, when a decoding signal /XDEC is driven to a ground voltage VSS, a block word signal BLKWL is enabled to a boost voltage VPP through an NMOS transistor 13 and a PMOS transistor 15. Furthermore, when the decoding signal /XDEC is driven to a power supply voltage VDD, the block word signal BLKWL is disabled to a ground voltage VSS by a disable unit 11.

NMOS transistor 13 is typically a depletion-type transistor. Therefore, even if a voltage close to a ground voltage VSS is applied to NMOS transistor 13, a predetermined amount of current flows. As a result, PMOS transistor 15 must be designed with a high threshold voltage when an output signal VOUT is disabled. Since PMOS transistor 15 has a high threshold voltage, it minimizes leakage current between the boost voltage VPP and the block word signal BLKWL.

However, in the level shifter of FIG. 1, a common junction terminal N14 between depletion-type NMOS transistor 13 and PMOS transistor 15 is connected to the bulk of PMOS transistor 15. That is, the threshold voltage Vtn1 (e.g., 2.5 V) of depletion-type NMOS transistor 13 is applied to the bulk of PMOS transistor 15 when the output signal VOUT is disabled. In this case, the threshold voltage Vtp of PMOS transistor 15 is about −0.7 V. For reference, when the block word signal BLKWL is enabled to a boost voltage VPP, the boost voltage VPP is applied to the bulk of PMOS transistor 15.

As a result, PMOS transistor 15 of FIG. 1 has a relatively low threshold voltage, so that relatively high sub-threshold current is generated. Particularly, when the level of a power supply voltage VDD, that is, the operating voltage of a nonvolatile semiconductor memory device incorporating the lever shifter circuit, decreases to about 1.8V, PMOS transistor 15 of FIG. 1 is turned ON, so that current I1 passing through depletion NMOS transistor 13 and PMOS transistor 15 increases considerably.

Accordingly, conventional level shifters, such the one illustrated above, and block driver circuits including such conventional level shifters have a problem with high levels of leakage current. Excessive leakage current is particularly undesirable in many contemporary running off battery power sources, such as cell phones, laptop computers, PDAs, etc.

SUMMARY OF THE INVENTION

Embodiments of the invention provide a level shifter, and an incorporating block driver, having reduced leakage current, and thereby providing decreased overall power consumption.

In one embodiment, the invention provides a level shifter adapted to generate an output signal having a swing voltage shifted by a positive boost voltage with respect to an input signal, and comprising; an enable unit adapted to enable the output signal in response to the input signal, and a disable unit adapted to disable the output signal in response to the input signal. The enable unit comprises: a shifting voltage terminal adapted to receive the boost voltage, a control node, a shifting unit disposed between the shifting voltage terminal and the control node and responsive to the output signal, such that a voltage having a difference with the boost voltage lower than a voltage of the output signal is provided to the control node, whereby the output signal is boosted by the positive boost voltage, a control PMOS transistor disposed between the control node and the output signal and gated by the input signal, and bulk voltage generation unit adapted to generate a predetermined bulk voltage having a voltage difference with the boost voltage lower than that of the control node to a bulk of the control PMOS transistor.

In another embodiment, the invention provides a level shifter adapted to generate an output signal having a swing voltage shifted by a negative boost voltage with respect to an input signal, and comprising; an enable unit adapted to enable the output signal in response to the input signal, and a disable unit adapted to disable the output signal in response to the input signal. The enable unit comprises; a shifting voltage terminal adapted to receive the boost voltage, a control node, a shifting unit disposed between the shifting voltage terminal and the control node and responsive to the output signal, such that a voltage having a difference with the boost voltage lower than a voltage of the output signal is provided to the control node, whereby the output signal is boosted by the negative boost voltage, a control MOS transistor disposed between the control node and the output signal and gated by the input signal, and bulk voltage generation unit adapted to generate a predetermined bulk voltage having a voltage difference with the boost voltage lower than that of the control node to a bulk of the control MOS transistor.

DESCRIPTION OF EXEMPLARY EMBODIMENTS

Figure 1:
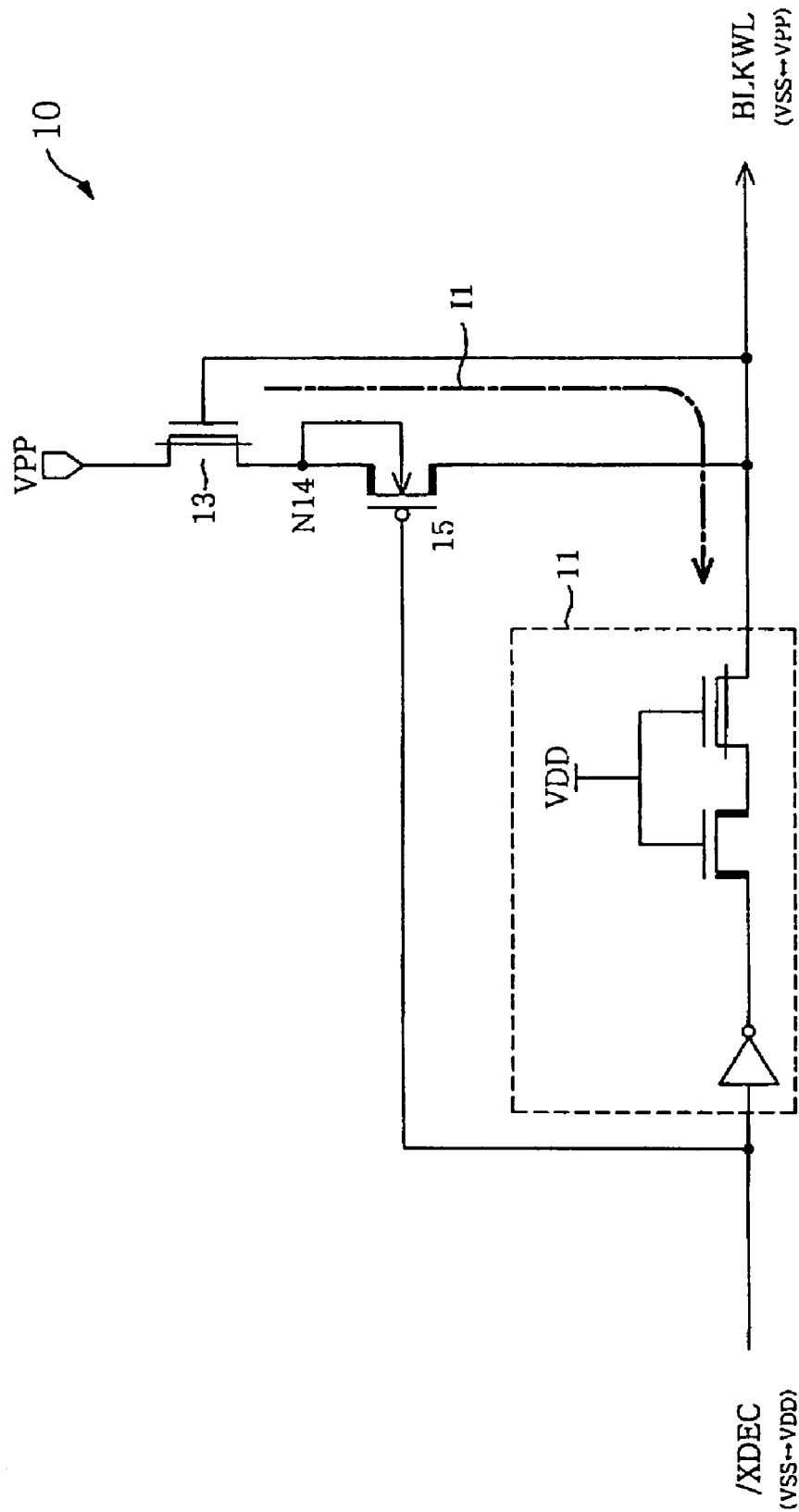
FIG. 1 is a circuit diagram illustrating a level shifter embedded in a conventional block driver.

Several embodiments of the invention will be described with reference to the accompanying drawings. However, those of ordinary skill in the art will recognize that the embodiments are presented as teaching examples. The present invention is not limited to only the illustrated examples, but may be variously embodied. Throughout the specification, like reference numerals indicate like elements.

Figure 2A:
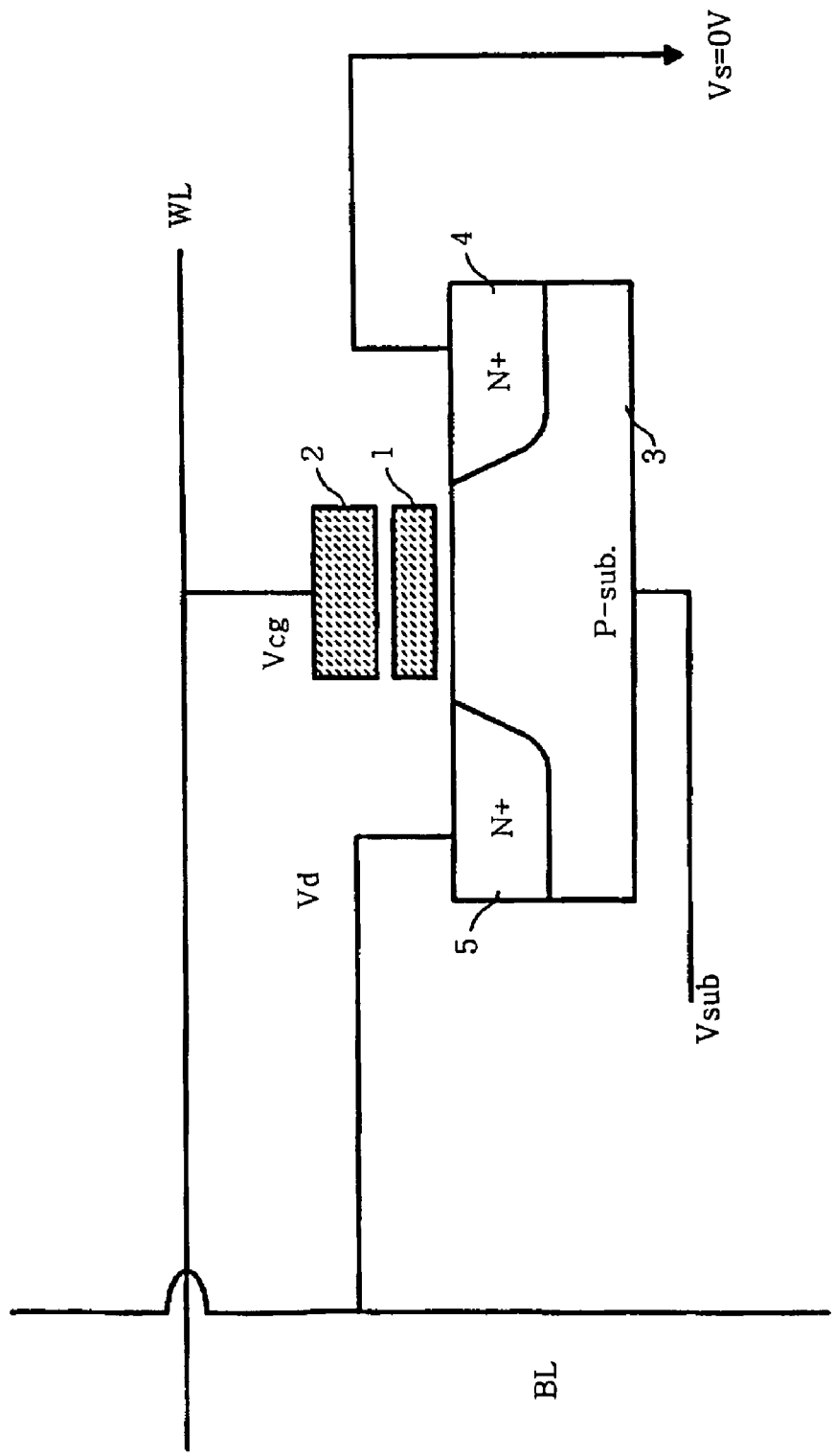
FIG. 2A is a diagram illustrating a typical memory cell structure connected to a word line and bit line in an exemplary nonvolatile semiconductor memory device.
Figure 2B:
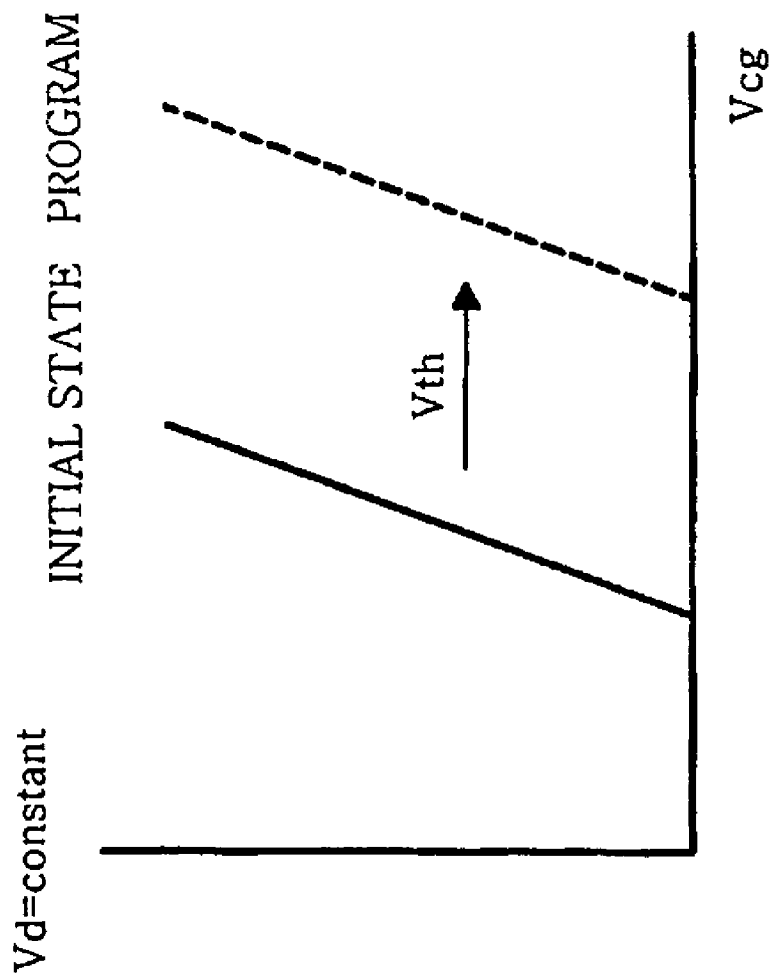
FIG. 2B is a voltage diagram illustrating threshold voltage characteristics for a memory cell.

Prior to the description of embodiments of the invention, the basic structure and programming theory of a nonvolatile semiconductor memory device to which the present invention can be applied are described. FIG. 2A is a diagram illustrating an exemplary structure for a memory cell connected to the word line and bit line of a nonvolatile semiconductor memory device. FIG. 2B is a diagram illustrating threshold voltage characteristics for a memory cell.

Referring collectively to FIGS. 2A and 2B, the exemplary memory cell includes a source region 4 and a drain region 5 formed in the surface of a substrate 3. In the example illustrated in FIG. 2A, substrate 3 is P-type, and source region 4 and drain region 5 are N+-type. A gate structure is arranged above a channel region defined between source region 4 and drain region 5. The gate structure includes a floating gate 1 and a control gate 2. Although not shown, a tunneling dielectric layer is inserted between floating gate 1 and the surface of substrate 3, and another thin oxide layer (or control dielectric layer) is inserted between floating gate 1 and control gate 2. In the illustrated example, drain voltage Vd is supplied from a bit line BL, the voltage Vcg of control gate 2 is supplied from a word line WL, and source voltage Vs is connected to a reference electric potential such as a ground voltage VSS.

The threshold voltage of the memory cell defines a stored logic value. That is, when the memory cell is in an initial state (also referred as an "erased state"), the threshold voltage is relatively low as illustrated in FIG. 2B. In contrast, when the memory cell is in a programmed state, the threshold voltage Vth is relatively high.

In order to convert the memory cell from the initial state to a programmed state, a well-known process referred to as Foweler-Nordheim tunneling (hereinafter, referred to as 'FN tunneling') is used. In this process, a relatively high positive (+) potential difference occurs between control gate 2 and substrate Psub, and electrons excited within the channel in the substrate Psub are trapped in floating gate 1. Such negative (−) charged electrons increase the threshold voltage of the memory cell.

Figure 3:
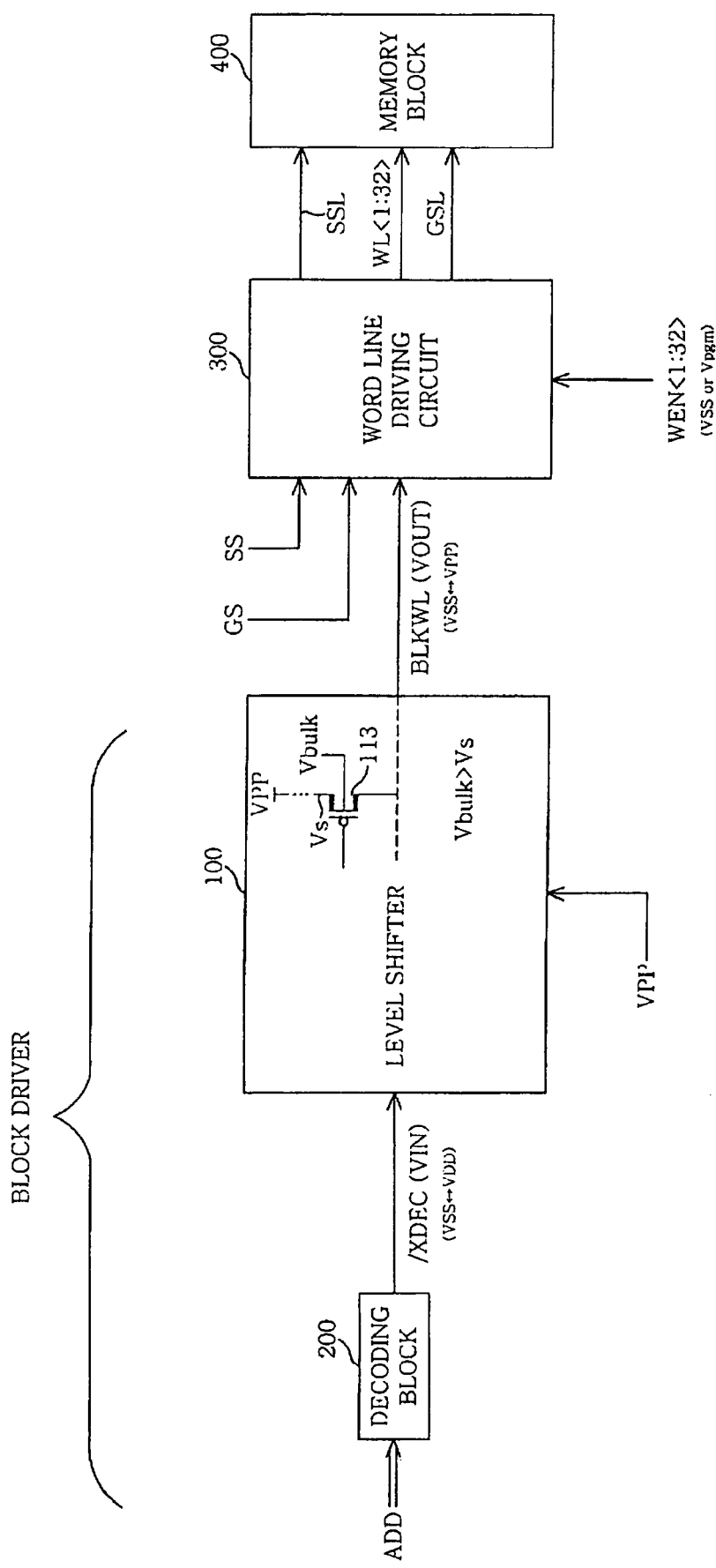
FIG. 3 is a block diagram illustrating a block driver according to an embodiment of the invention.

With this background in place, an embodiment of the invention will now be described with reference FIG. 3. The block diagram of FIG. 3 shows an exemplary block driver. The block driver generally comprises a level shifter 100 and a decoding block 200, and is adapted to generate a block word signal BLKWL which is enabled to a shifting voltage, that is, a positive boost voltage VPP (for example, 25 V), based on a received address ADD.

The block word signal BLKWL is provided to a word line driving circuit 300. Word line driving circuit 300 provides the voltage levels of word line enable signals WEN<1:32> to word lines WL<1:32> which drive the memory cells of a memory block 400. At this time, word line enable signals WEN corresponding to the word lines WL which drive the memory cells to be programmed have a program voltage Vpgm.

Level shifter 100 uses a decoding signal /XDEC provided from decoding block 200 as an input signal VIN and the block word signal BLKWL provided to word line driving circuit 300 as an output signal VOUT. Furthermore, the block word signal BLKWL has a voltage level that depends on the decoding signal /XDEC. At this time, the decoding signal /XDEC is a signal that swings between a ground voltage VSS (for example, 0V) and a power supply voltage VDD (for example, 1.7 V), and has the swing voltage of the power supply voltage VDD. In contrast, the block word signal BLKWL is a signal that swings between the ground voltage VSS and a boost voltage VPP (for example, 1.7 V), and has the swing voltage of the boost voltage VPP. As a result, the swing voltage of the block word signal BLKWL is level-shifted from the power supply voltage VDD to the boost voltage VPP with respect to the decoding signal /XDEC.

Level shifter 100 includes a control PMOS transistor 113. Control PMOS transistor 113 is eventually driven to provide the boost voltage VPP as the block word signal BLKWL when the block word signal BLKWL is enabled. Furthermore, control PMOS transistor 113 is driven to cut off the connection between the boost voltage VPP and the block word signal BLKWL when the block word signal BLKWL is disabled.

In the illustrated example, it should be noted that when the block word signal BLKWL is disabled, a bulk voltage higher than the voltage of a source terminal Vs is applied to the bulk of control PMOS transistor 113, which is described below in some additional detail.

Decoding block 200 generates the decoding signal /XDEC based on the address ADD. When an address designating memory block 400 is generated, the decoding signal /XDEX is changed from the power supply voltage VDD to the ground voltage VSS. At this time, the block word signal BLKWL is changed from the ground voltage VSS to the boost voltage VPP.

Figure 4:
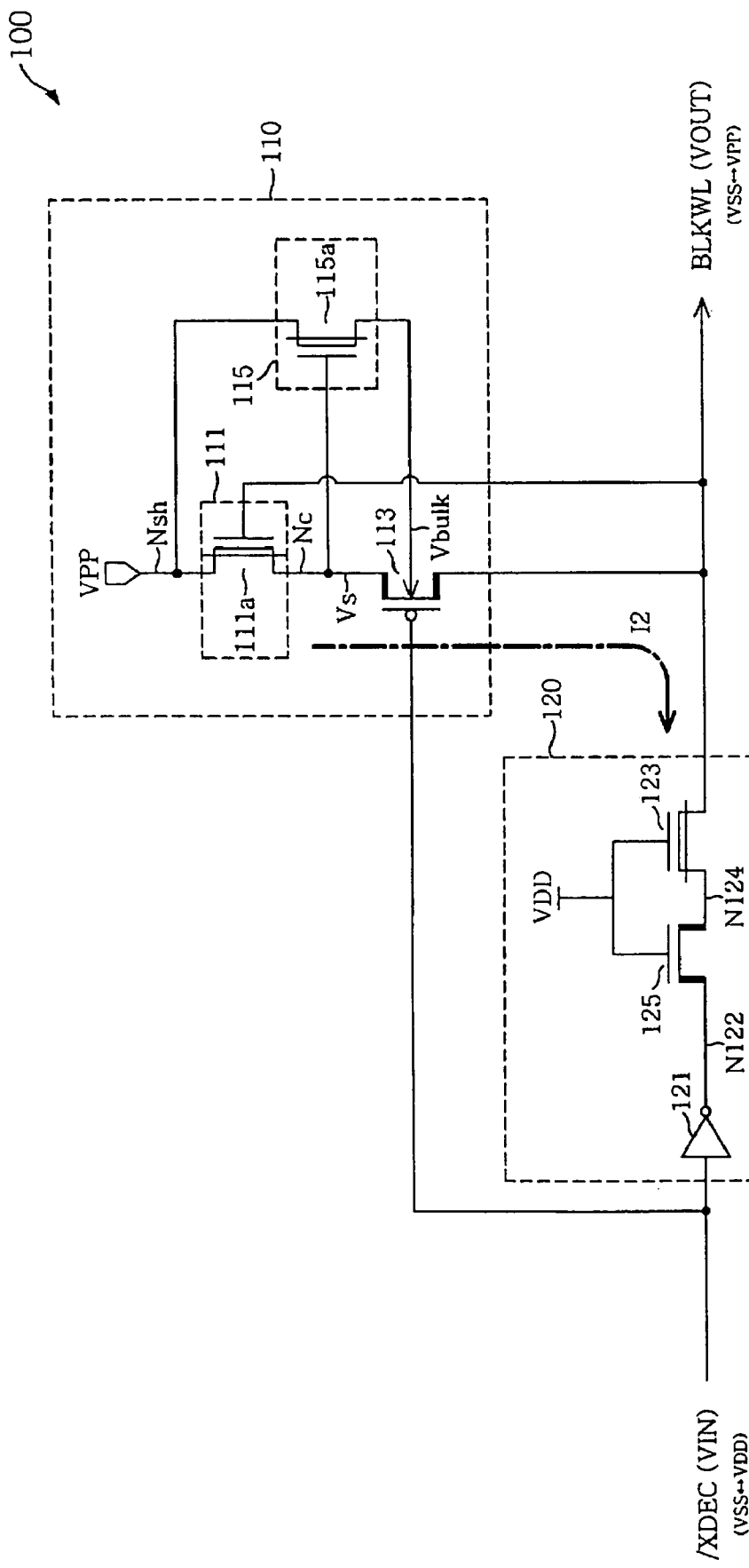
FIG. 4 is a circuit diagram illustrating the level shifter of FIG. 3 in some additional detail.

FIG. 4 is a circuit diagram illustrating level shifter 100 of FIG. 3 in some additional detail. Referring to FIG. 4, level shifter 100 comprises an enable unit 110 and a disable unit 120. Enable unit 110 enables the block word signal BLKWL to the boost voltage VPP when the decoding signal /XDEC is driven to the ground voltage VSS. Furthermore, disable unit 120 disables the block word signal BLKWL to the ground voltage VSS when the decoding signal /XDEC is driven to the power supply voltage VDD.

Particularly, enable unit 110 includes a shifting voltage terminal Nsh, a control node Nc, a shifting unit 111, control PMOS transistor 113, and a bulk voltage generation unit 115. The boost voltage VPP that corresponds to the shifting voltage is received through the shifting voltage terminal Nsh.

Shifting unit 111 is formed between the shifting voltage terminal Nsh and the control node Nc in order to enable the block word signal BLKWL to the boost voltage VPP. Furthermore, shifting unit 111 is gated by the block word signal BLKWL. The voltage difference between the boost voltage VPP and the voltage of the control node Nc becomes larger than the voltage difference between the boost voltage VPP and the voltage of the block word signal BLKWL from shifting unit 111. That is, the voltage level of the control node Nc is higher than that of the block word signal BLKWL.

Preferably, shifting unit 111 includes a depletion-type shifting NMOS transistor 111a. The shifting NMOS transistor 111a is formed between the shifting voltage terminal Nsh and the control node Nc, and is gated with the block word signal BLKWL. Therefore, the voltage Vs of the control node Nc is higher than that of the block word signal BLKWL, by about the threshold voltage Vtn of NMOS transistor 111, when the word block signal BLKWL is disabled.

Control PMOS transistor 113 is formed between the control node Nc and the word block signal BLKWL, and is gated with the decoding signal /XDEC. In this embodiment, the voltage Vs of the control node Nc acts as the voltage of the source terminal of control PMOS transistor 113.

Bulk voltage generation unit 115 generates a bulk voltage Vbulk based on the control node Nc to the bulk of control PMOS transistor 113. At this time, the bulk voltage Vbulk has a voltage level higher than that of the control node Nc when the block word signal BLKWL is disabled.

Preferably, bulk voltage generation unit 115 includes a depletion-type bulk NMOS transistor 115a. Bulk NMOS transistor 115a is formed between the shifting voltage terminal Nsh and the bulk of control PMOS transistor 113. Furthermore, bulk NMOS transistor 115a is gated by the control node Nc. Therefore, the bulk voltage Vbulk has a voltage level of about the sum of the threshold voltage Vtn1 of first NMOS transistor 111 and the threshold voltage Vtn2 of second NMOS transistor 115a, rather than the voltage level of the block word signal BLKWL, when the block word signal BLKWL is disabled. In the illustrated embodiment, voltages Vtn1 and Vtn2 are about 2.5 V.

As a result, a voltage having a voltage level of (Vtn1+Vtn2) is applied to the bulk of the control PMOS transistor when the block word signal BLKWL is disabled. That is, a voltage having a level relatively higher that of the Vtn1 applied to the bulk of the PMOS transistor 15 of FIG. 1 is applied to the bulk of control PMOS transistor 13.

As a result, control PMOS transistor 113, as adapted for use within embodiments of the invention, has relatively high threshold voltage compared to the PMOS transistor of the conventional level shifter (see, e.g., FIG. 1). This is caused by a well-known bulk effect. For reference, the boost voltage (for example, 25 V) is applied to the bulk of control PMOS transistor 113 when the block word signal BLKWL is enabled.

As the level of the threshold voltage increases, the current corresponding to the sub-threshold voltage of control PMOS transistor 113 is lowered. Particularly, even when the level of the operating voltage, that is, the power supply voltage VDD, of a nonvolatile semiconductor memory device is lowered to 1.8 V, control PMOS transistor 113 is maintained in a OFF state.

Figure 5:
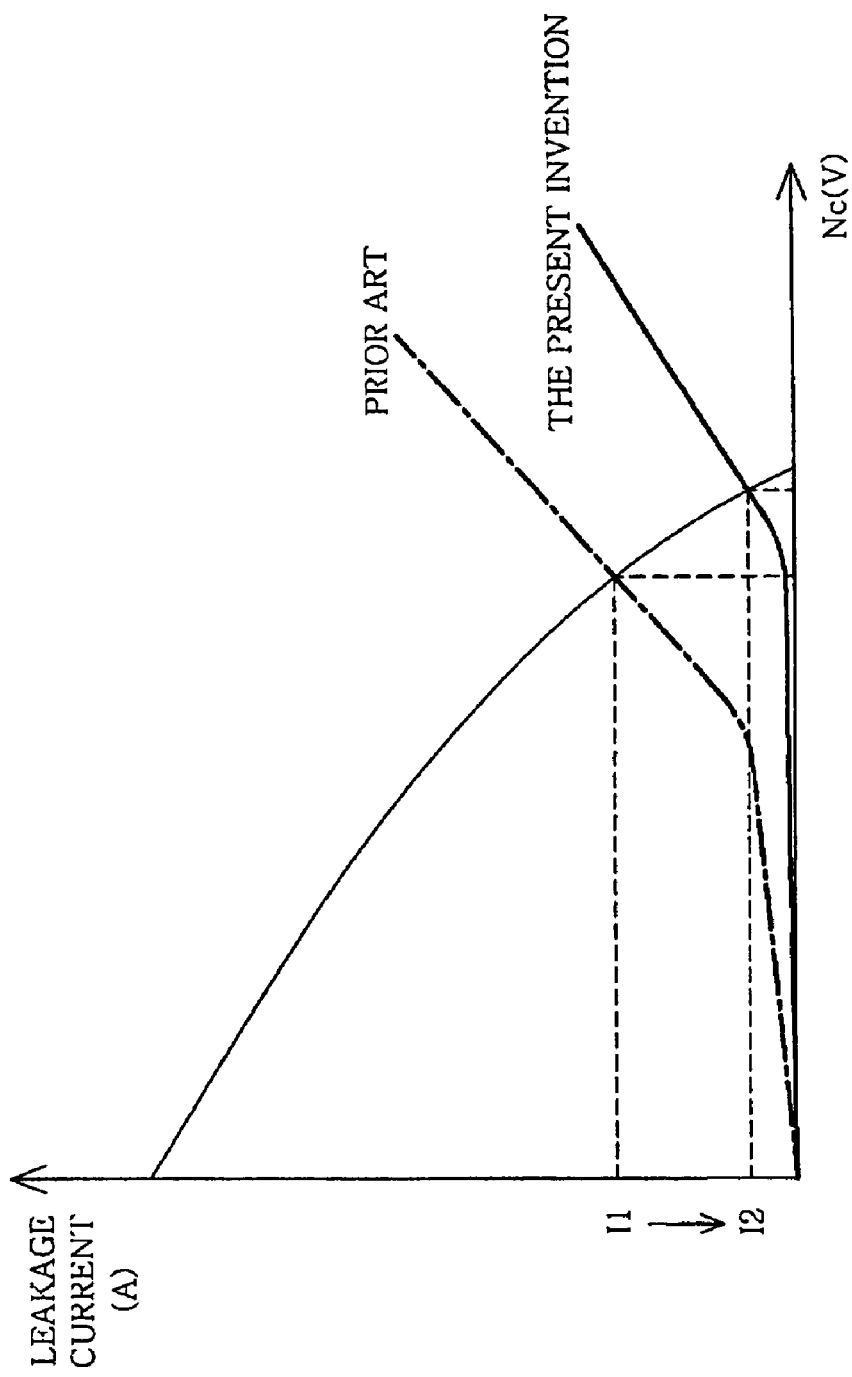
FIG. 5 is a voltage diagram illustrating reduced leakage current provided by a level shifter according to an embodiment of the invention.

According to the exemplary level shifter and incorporating block driver, leakage current I2 flowing through shifting NMOS transistor 111a and control PMOS transistor 113 decreases considerably compared to the conventional leakage current I1, as illustrated in FIG. 5.

Figure 6:
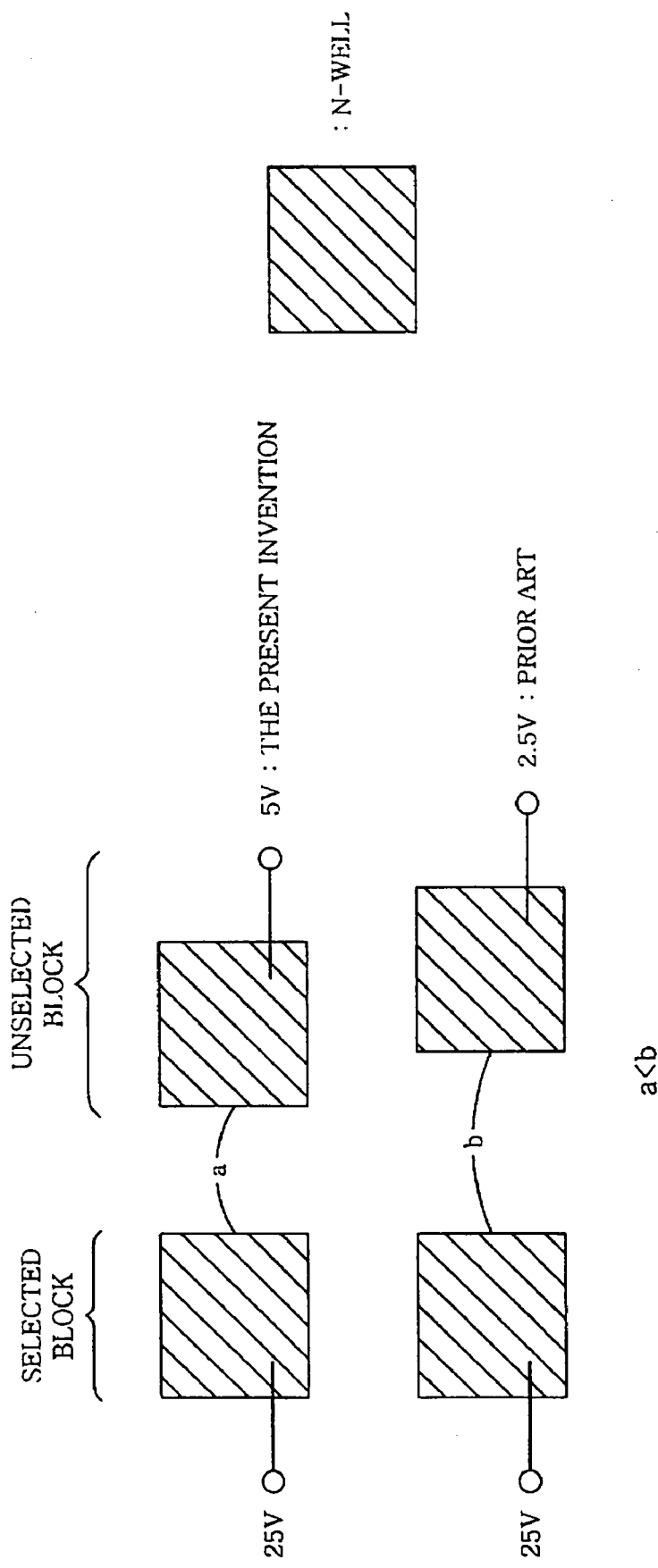
FIG. 6 is a diagram illustrating the difference between a voltage applied to an N-well of a selected block and a voltage applied to the N-well of an adjacent block in a nonvolatile semiconductor memory device employing a level shifter and block driver according to an embodiment of the invention.

FIG. 6 is a diagram illustrating the difference between a voltage applied to the N-well of a selected block and a voltage applied to the N-well of an adjacent block in a nonvolatile semiconductor memory device employing a level shifter and an incorporating block driver according to an embodiment of the invention. In this case, the N-well of each block forms the bulk of PMOS transistor 113. Referring to the FIG. 6, a boost voltage VPP (for example, 25 V) is applied to the N-well of a selected level shifter, which is the same as in the prior art. In contrast, voltage having a level of (Vtn1+Vtn2; about 5 V) is applied to the N-well of the (unselected) block adjacent to the selected block. This voltage level is considerably higher than that applied in the conventional level shifter in which a voltage level Vtn1 of about 2.5 V is applied.

As a result, the voltage difference between N-wells of the selected block and the adjacent (unselected) block is about 20 V. This is considerably lower than the 22.5 V associated with the conventional level shifter. Therefore, a breakdown voltage between the N-wells is considerably increased. In order words, according to embodiments of the invention, the space between the N-wells may be decreased, and, thus, the overall size of a memory chip may also be decreased.

Referring again to FIG. 4, disable unit 120 comprises an inverter 121, and first and second NMOS transistors 123 and 125. The inverter 121 inverts the decoding signal /XDEC.

First disable NMOS transistor 123 is a depletion-type transistor, one end of which is connected to the block word signal BLKWL and which is gated by the power supply voltage VDD, that is, the swing voltage of the decoding signal /XDEX.

Furthermore, second disable NMOS transistor 125 is an enhancement-type transistor, one end of which is connected to the other end N124 of the first disable NMOS transistor 123 and which is gated with the power supply voltage VDD.

The block word signal BLKWL is disabled to the ground voltage VSS by disable unit 120. Although the voltage of the block word signal BLKWL is boosted to the boost voltage VPP, the voltage applied to output terminal N122 of inverter 121 of disable unit 120 can be controlled below voltage than the power supply voltage VDD.

Figure 7:
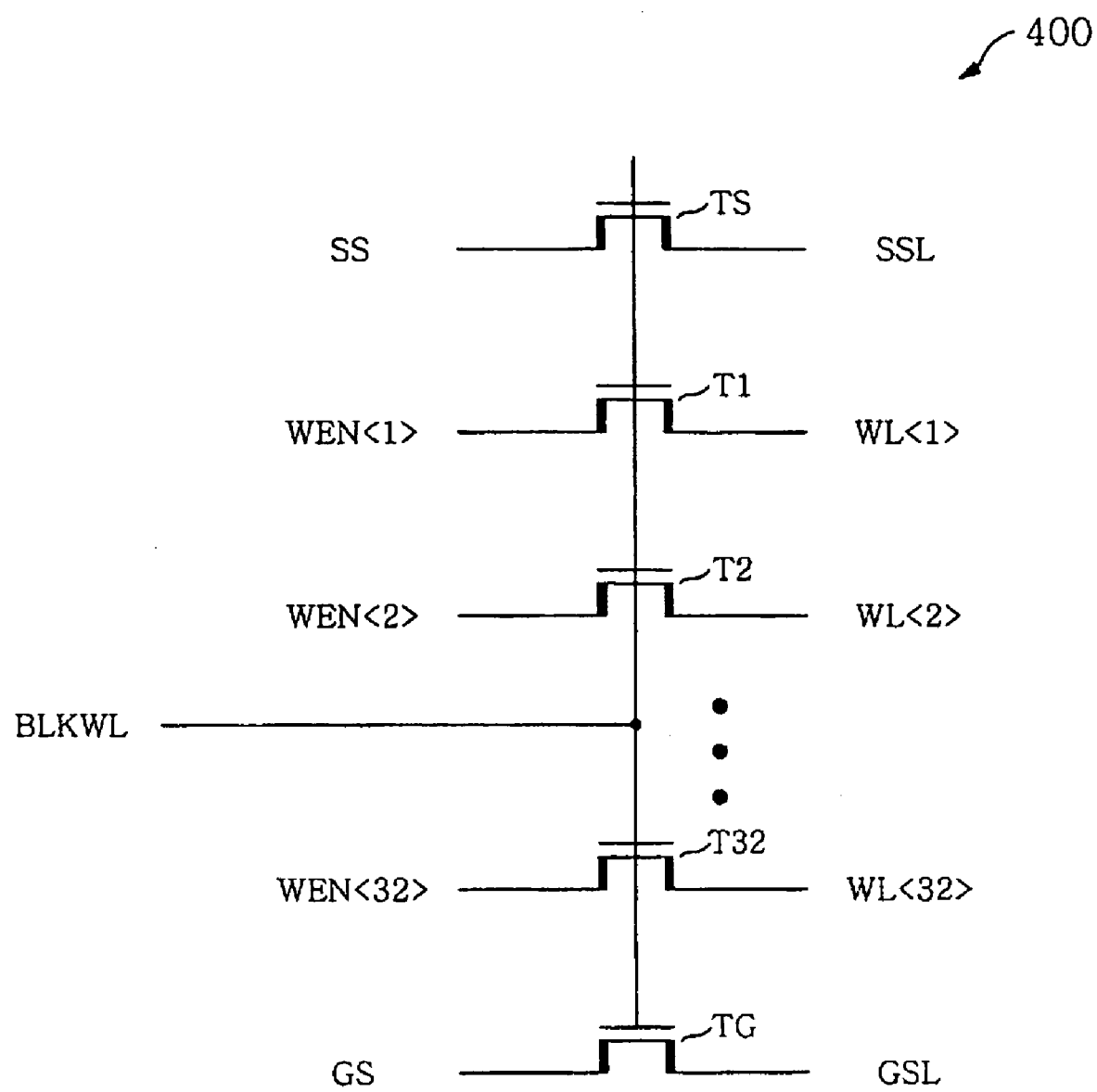
FIG. 7 is a diagram illustrating the word line driving circuit of FIG. 3 in some additional detail.

FIG. 7 is a diagram further illustrating the word line driving circuit 300 of FIG. 3. When the word block signal BLKWL is enabled to the boost voltage VPP, transmission transistors TS, T1~T32 and TG are turned on, a string selection voltage SS, the voltage of the word enable signals WEN<1:32>, and a ground selection voltage are transmitted to a string selection line SSL, the word lines WL<1:32>, and a ground selection line GSL, respectively. In contrast, when the block word signal BLKWL is disabled to the ground voltage VSS, the transmission transistors TS, T1~T32 and TG are turned off.

Alternatively, embodiments of the invention may be implemented with a swing voltage modified by a negative boost voltage.

Figure 8:
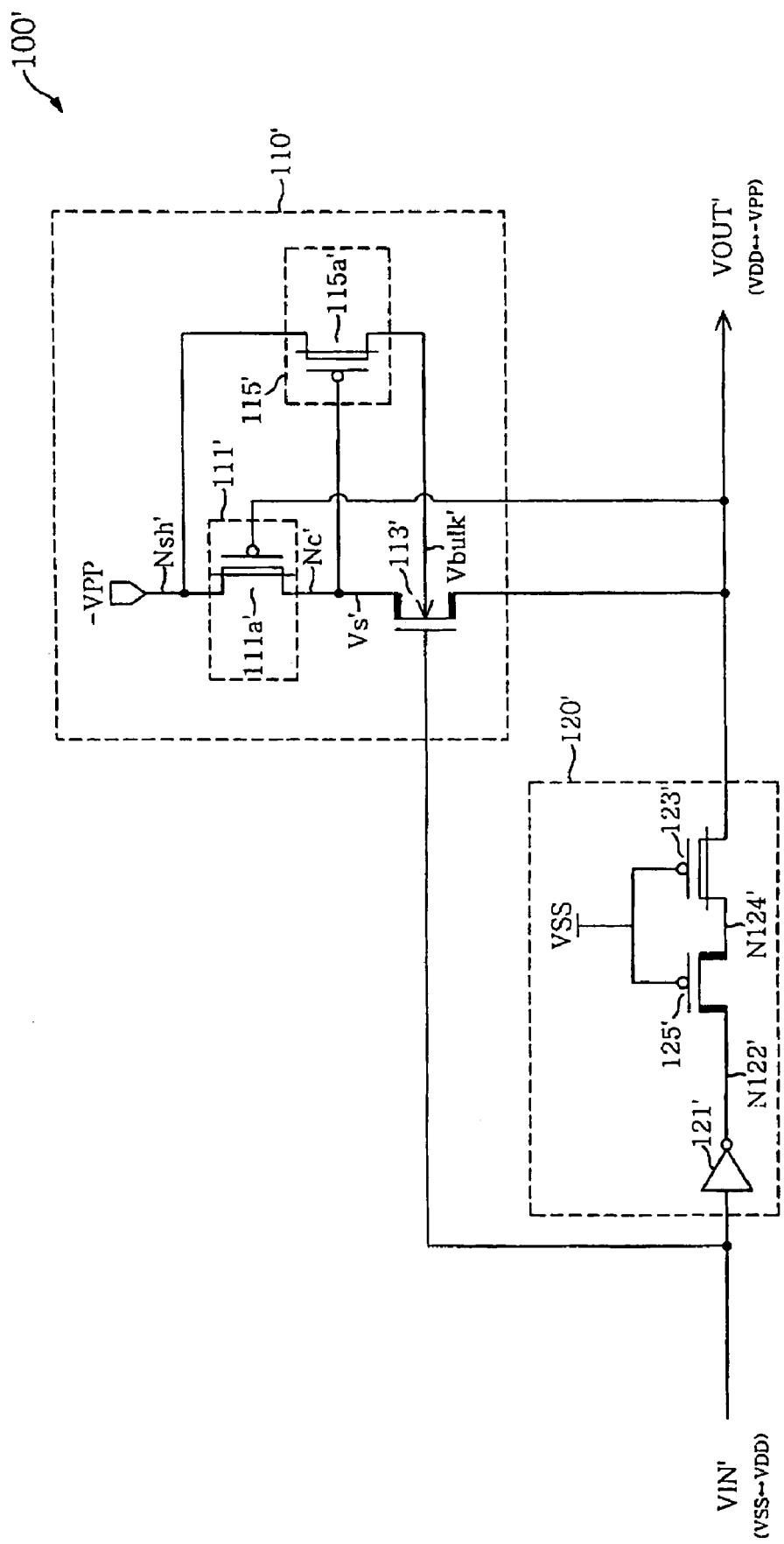
FIG. 8 is a circuit diagram illustrating a level shifter according to another embodiment of the invention.

FIG. 8 is a diagram illustrating a level shifter 100' according to another embodiment of the invention. In the embodiment of FIG. 8, the swing voltage of an input signal VIN' is a ground voltage VSS, and the swing voltage of an output signal is a negative boost voltage −VPP. The swing voltage is shifted from the ground voltage VSS to the negative boost voltage −VPP by level shifter 100' of FIG. 8.

Therefore, the level shifter of FIG. 8 is different from the level shifter of FIG. 4 only in the polarities of embedded transistors. As a result, the reference numerals and characters of respective elements in the embodiment of FIG. 8 are illustrated with the apostrophe (') being added to the corresponding reference numerals and characters of respective elements in the embodiment of FIG. 4.

The construction and operation of level shifter 100' of FIG. 6 may be easily understood by those skilled in the art with reference to the description of the construction and operation of level shifter 100 of FIG. 4. Therefore, detailed descriptions thereof are omitted here.

In the above-described level shifter and block driver, the level of a bulk voltage applied to the bulk of a control PMOS transistor, which is formed between a boost voltage and a block word signal, increases. Accordingly, the threshold voltage of the control PMOS transistor increases. As a result, leakage current from the boost voltage to the block word signal decreases considerably, thereby reducing overall power consumption.

Furthermore, in a level shifter and incorporating block driver according to the present invention, the voltage difference between the N-wells of a selected block and an adjacent block decreases considerably, thereby reducing the space between the N-wells.

Although the several embodiments of the invention have been disclosed for illustrative purposes, those skilled in the art will appreciate that various modifications, additions and substitutions are possible, without departing from the scope of the invention as defined by the following claims.

What is claimed is:

1. A level shifter adapted to generate an output signal having a swing voltage shifted by a positive boost voltage with respect to an input signal, and comprising:
    an enable unit adapted to enable the output signal in response to the input signal, and a disable unit adapted to disable the output signal in response to the input signal;
    wherein the enable unit comprises:
        a shifting voltage terminal adapted to receive the boost voltage;
        a control node;
        a shifting unit disposed between the shifting voltage terminal and the control node and responsive to the output signal, such that a voltage having a difference with the boost voltage lower than a voltage of the output signal is provided to the control node, whereby the output signal is boosted by the positive boost voltage;
        a control PMOS transistor disposed between the control node and the output signal and gated by the input signal; and
        a bulk voltage generation unit receiving the boost voltage through the shifting voltage terminal and a voltage apparent at the control node, and generating a predetermined bulk voltage having a voltage level higher than the voltage apparent at the control node when the output signal is disabled, and applying the predetermined bulk voltage to a bulk of the control PMOS transistor.

2. The level shifter of claim 1, wherein the bulk voltage generation unit is disposed between the shifting voltage terminal and the bulk of the control PMOS transistor, and comprises a depletion-type bulk NMOS transistor gated by the voltage apparent at the control node.

3. The level shifter of claim 1, wherein the shifting unit comprises a depletion-type shifting NMOS transistor gated by the output signal.

4. The level shifter of claim 1, wherein the disable unit comprises:
    an inverter receiving and inverting the input signal;
    a depletion-type first disable NMOS transistor providing at one end the output signal, and gated by a power supply voltage; and
    an enhancement-type second disable NMOS transistor connected at one end to another end of the first disable NMOS transistor, and at another end to the inverter to receive the inverted input signal, and gated by the power supply voltage.

5. The level shifter of claim 1, wherein the input signal is a decoding signal received in the enable unit and the disable unit from an address decoding block external to the level shifter.

6. The level shifter of claim 5, wherein the output signal is a block word signal provided to a word line driving circuit external to the level shifter.

7. A level shifter adapted to generate an output signal having a swing voltage shifted by a negative boost voltage with respect to an input signal, and comprising:
    an enable unit adapted to enable the output signal in response to the input signal, and a disable unit adapted to disable the output signal in response to the input signal;
    wherein the enable unit comprises:
        a shifting voltage terminal adapted to receive the boost voltage;
        a control node;
        a shifting unit disposed between the shifting voltage terminal and the control node and responsive to the output signal, such that a voltage having a difference with the boost voltage lower than a voltage of the output signal is provided to the control node, whereby the output signal is boosted by the negative boost voltage;
        a control MOS transistor disposed between the control node and the output signal and gated by the input signal; and
        a bulk voltage generation unit receiving the boost voltage through the shifting voltage terminal and a voltage apparent at the control node, and generating a predetermined bulk voltage having a voltage level higher than the voltage apparent at the control node when the output signal is disabled, and applying the predetermined bulk voltage to a bulk of the control PMOS transistor.

8. The level shifter of claim 7, wherein the bulk voltage generation unit is disposed between the shifting voltage terminal and the bulk of the control MOS transistor, and comprises a depletion-type bulk MOS transistor gated by the voltage apparent at the control node.

9. The level shifter of claim 7, wherein the shifting unit comprises a depletion-type shifting MOS transistor gated by the output signal.

10. The level shifter of claim 7, wherein the disable unit comprises:
    an inverter receiving and inverting the input signal;
    a depletion-type first disable NMOS transistor providing at one end the output signal, and gated by a power supply voltage; and
    an enhancement-type second disable NMOS transistor connected at one end to another end of the first disable NMOS transistor, and at another end to the inverter to receive the inverted input signal, and gated by the power supply voltage.

11. The level shifter of claim 7, wherein the input signal is a decoding signal received in the enable unit and the disable unit from an address decoding block external to the level shifter.

12. The level shifter of claim 11, wherein the output signal is a block word signal provided to a word line driving circuit external to the level shifter.

* * * * *